(12) United States Patent
Park

(10) Patent No.: US 9,034,731 B2
(45) Date of Patent: May 19, 2015

(54) INTEGRATED, INTEGRATED CIRCUIT SINGULATION SYSTEM

(75) Inventor: Seung Wook Park, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 1051 days.

(21) Appl. No.: 11/162,622

(22) Filed: Sep. 16, 2005

(65) Prior Publication Data

US 2006/0169680 A1 Aug. 3, 2006

Related U.S. Application Data

(60) Provisional application No. 60/649,838, filed on Feb. 3, 2005.

(51) Int. Cl.
*H01L 21/00* (2006.01)
*H01L 21/78* (2006.01)
*B23K 26/40* (2014.01)

(52) U.S. Cl.
CPC ............ *H01L 21/78* (2013.01); *B23K 26/4075* (2013.01)

(58) Field of Classification Search
USPC .................................................. 438/460, 463
See application file for complete search history.

(56) References Cited

U.S. PATENT DOCUMENTS

| | | | |
|---|---|---|---|
| 5,521,931 A * | 5/1996 | Biegelsen et al. | 372/36 |
| 6,313,434 B1 * | 11/2001 | Patterson et al. | 219/121.69 |
| 6,420,245 B1 * | 7/2002 | Manor | 438/460 |
| 6,562,698 B2 * | 5/2003 | Manor | 438/460 |
| 6,653,210 B2 | 11/2003 | Choo et al. | 438/460 |
| 6,734,083 B2 * | 5/2004 | Kobayashi | 438/462 |
| 6,737,606 B2 | 5/2004 | Peng et al. | 219/121.68 |
| 6,841,482 B2 | 1/2005 | Boyle | 438/708 |
| 7,129,114 B2 * | 10/2006 | Akram | 438/110 |
| 7,241,669 B2 * | 7/2007 | Swenson et al. | 438/463 |
| 7,303,977 B2 * | 12/2007 | Voronov et al. | 438/463 |
| 2001/0013510 A1 * | 8/2001 | Wiener-Avnear et al. | 219/121.69 |
| 2001/0054606 A1 | 12/2001 | Weishauss et al. | B23K 26/04 |
| 2002/0033558 A1 * | 3/2002 | Fahey et al. | 264/400 |
| 2003/0047543 A1 * | 3/2003 | Peng et al. | 219/121.68 |
| 2005/0042805 A1 * | 2/2005 | Swenson et al. | 438/113 |
| 2006/0030125 A1 * | 2/2006 | Sackrison et al. | 438/460 |
| 2006/0249480 A1 * | 11/2006 | Boyle | 216/63 |

\* cited by examiner

*Primary Examiner* — Angel Roman
(74) *Attorney, Agent, or Firm* — Ishimaru & Associates LLP

(57) ABSTRACT

An integrated, integrated circuit singulation system is provided including scribing a substrate using mechanical cutting or a plurality of passes of laser cutting, and dicing the substrate using mechanical cutting or laser cutting.

10 Claims, 5 Drawing Sheets

INTEGRATED, INTEGRATED CIRCUIT SINGULATION SYSTEM

CROSS-REFERENCE TO RELATED APPLICATION(S)

This application claims the benefit of U.S. Provisional Patent Application Ser. No. 60/649,838 filed Feb. 3, 2005, and the subject matter thereof is hereby incorporated herein by reference thereto.

TECHNICAL FIELD

The present invention relates generally to integrated circuit singulation, and more particularly to a system for integrated circuit singulation via mechanical and laser cutting.

BACKGROUND ART

In the past, there have been two separate systems in two separate machines for integrated circuit singulation based on wafer thickness and material. One is mechanical cutter dicing and the other is laser dicing. These techniques are typically employed in the end stages of integrated circuit fabrication when singulation of the integrated circuit chip is desired from the wafer in which it is formed. The thus formed integrated circuit chips are then placed within devices such as cellphones, videocameras, portable music players, microwaves, computers, etc.

Currently the industry uses mechanical cutting with a high precision circular cutter to singulate individual chips from a wafer. Older mechanical cutting methods employed a 50% cut through method followed by a breaking process, but this method is no longer acceptable for ULSI devices. Present day mechanical cutting methods use a 90 to 100% cut through technique, but this technique is still subject to substantial chipping, cracking, silicon dust production and corrosion.

Industry also currently uses laser dicing to singulate individual chips from a wafer. Laser dicing provides good quality dicing for thin wafers, low-k dielectrics, adhesives and copper wafers. Although laser dicing reduces some of the mechanical stresses introduced by mechanical cutting, it is privy to localized heating defects. Localized heating can cause unwanted melting of some materials, thereby causing reflow, as well as unwanted diffusion of some mobile ionic contaminants. The unwanted reflow and unwanted diffusion can lead to device failure due to short-circuiting. Additionally, laser dicing is unable to cut thick wafers efficiently, and consequently, the units per hour processed by laser dicing is inadequate for high throughput production processes.

Thus, despite recent developments in semiconductor dicing techniques, a need still remains for improved singulation techniques that will produce a high yield at the die/chip separation phase.

Solutions to these problems have been long sought but prior developments have not taught or suggested any solutions and, thus, solutions to these problems have long eluded those skilled in the art.

DISCLOSURE OF THE INVENTION

The present invention provides an integrated, integrated circuit singulation system including scribing a substrate using mechanical cutting or a plurality of passes of laser cutting, and dicing the substrate using mechanical cutting or laser cutting.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
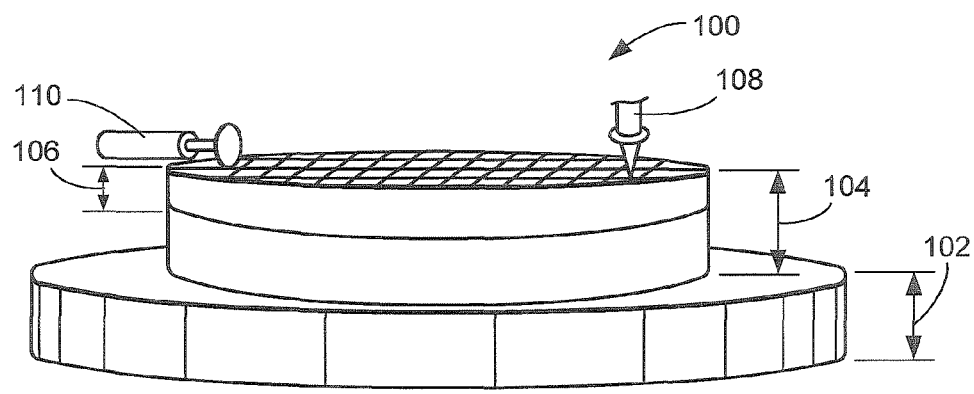
FIG. 1 is an isometric cross-sectional view of a portion of a wafer structure in accordance with an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGs. In addition, where multiple embodiments are disclosed and described having some features in common, for clarity and ease of illustration, description, and comprehension thereof, similar and like features one to another will ordinarily be described with like reference numerals.

The following embodiments are described in sufficient detail to enable those skilled in the art to make and use the invention, and it is to be understood that other embodiments would be evident based on the present disclosure and that process or mechanical changes may be made without departing from the scope of the present invention.

The term "horizontal" as used herein is defined as a plane parallel to the plane or surface of the wafer, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The terms "wafer" and "substrate" are used interchangeably herein.

Referring now to FIG. 1, therein is shown an isometric cross-sectional view of a portion of a wafer structure 100 in accordance with an embodiment of the present invention. The wafer structure 100 illustrates a wafer 104 attached to an adhesive tape 102. The wafer 104 may be comprised by, for example and not by way of limitation, a semiconductor material. The adhesive tape 102 may be comprised by, for example and not by way of limitation, a dicing tape. The opposing side of the adhesive tape 102 is then normally attached to a rigid frame (not shown). The adhesive tape 102 holds the wafer intact once all chips are diced.

The top portion of the wafer 104 includes an active layer 106. By way of example, and not intended to limit the scope of applicable components, the active layer 106 may be comprised by active components and/or passive components. The active layer 106 comprised by active and/or passive components is fabricated from, for example, a combination of passivation layers, dielectrics, oxides, nitrides, metallic layers, non-metallic layers and semiconductor layers. It is this diverse composition of the active layer 106 that precipitated the need for a varied scribing and dicing method (i.e.—cutting and lasing or lasing and cutting).

FIG. 1 also shows a laser cutter 108 and a mechanical cutter 110. As described later in greater detail, the laser cutter 108 or the mechanical cutter 110 dices the wafer 104 after completion of scribing the wafer 104 by either the laser cutter 108 or the mechanical cutter 110. As used herein, the term "scribe" is defined as partially cutting into a substrate or wafer and not cutting completely through the substrate or wafer. Additionally, as used herein, the term "dicing" is defined as completely cutting through the substrate or wafer.

Figure 2:
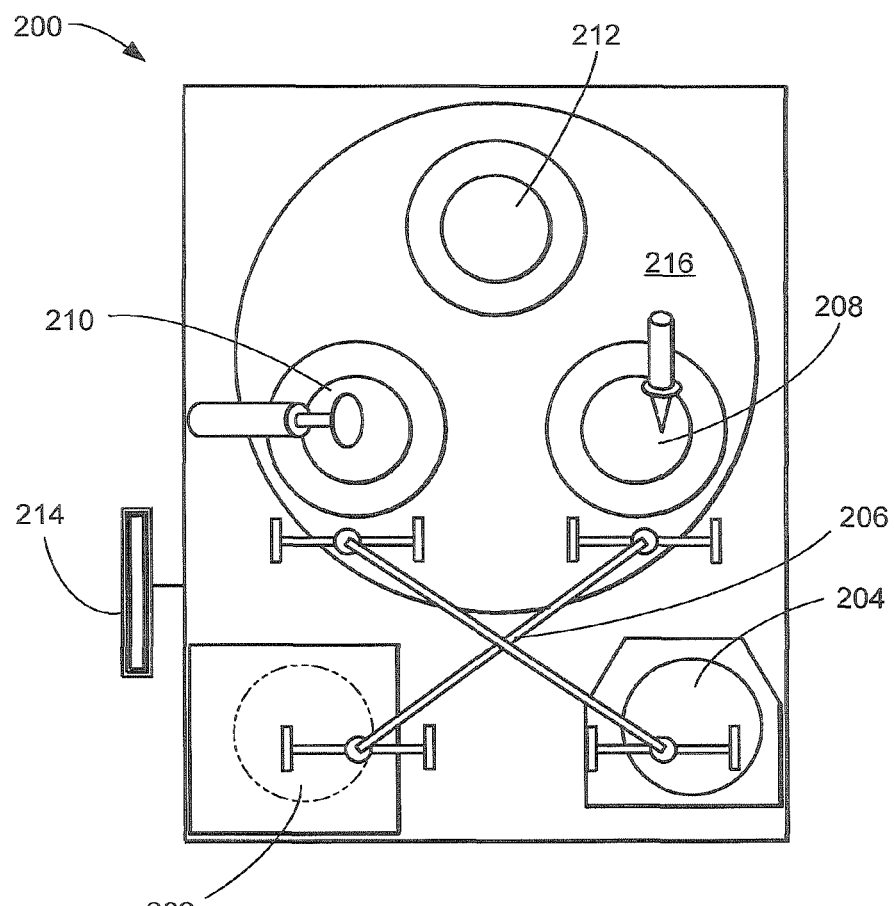
FIG. 2 is a top view of an in-line dicing machine in accordance with an embodiment of the present invention.

Referring now to FIG. 2, therein is shown a top view of an in-line dicing machine 200 in accordance with an embodiment of the present invention. The in-line dicing machine 200 includes a wafer cassette zone 202, a pre-alignment stage 204, a transfer arm 206, a laser cutting zone 208, a mechanical cutting zone 210, a cleaning zone 212, an operation panel 214, and chuck table 216.

By way of example and not by way of limitation, the following provides an example of how the in-line dicing machine 200 operates. A wafer enters the in-line dicing machine 200 via wafer cassette zone 202 and is then transferred to the pre-alignment stage 204. Then the transfer arm 206 engages the wafer and transfers the wafer from the pre-alignment stage 204 to either the laser cutting zone 208 or the mechanical cutting zone 210. At this stage in the process, the wafer can either be scribed or diced. If diced, the wafer is then transferred to the cleaning zone 212 by rotation of the chuck table 216. If the wafer is scribed, then the wafer is transferred to either the laser cutting zone 208 or the mechanical cutting zone 210, depending on which zone scribed the wafer, for dicing. The wafer is transferred by rotation of the chuck table 216.

After the wafer is scribed and then diced, the wafer is then rotated to the cleaning zone 212 via the chuck table 216. During rotation of the diced wafer to the cleaning zone 212, a new wafer can be transferred from the pre-alignment stage 204 into either the laser cutting zone 208 or the mechanical cutting zone 210. After the new wafer is scribed, it is either rotated to the laser cutting zone 208 or the mechanical cutting zone 210 for dicing. At this time, the wafer within the cleaning zone 212 is either rotated to the laser cutting zone 208 or the mechanical cutting zone 210, depending on which zone is open.

The diced and cleaned wafer is then engaged by the transfer arm 206 and transferred to the pre-alignment stage 204. From the pre-alignment stage 204, the wafer is then unloaded to the wafer cassette zone 202. This in-line dicing machine 200 process can be controlled by operator input at the operation panel 214.

According to an operator input at the operation panel 214, the in-line dicing machine 200 will either scribe a wafer at the laser cutting zone 208 or scribe the wafer at the mechanical cutting zone 210. Additionally, depending upon the operator's input as to the location of scribing, then the in-line dicing machine 200 will either dice the wafer at the laser cutting zone 208 or dice the wafer at the mechanical cutting zone 210. For example, the in-line dicing machine 200 could be programmed to scribe the wafer at the laser cutting zone 208 and then dice the wafer at the mechanical cutting zone 210. Additionally, the in-line dicing machine 200 could be programmed to scribe the wafer at the mechanical cutting zone 210 and then dice the wafer at the laser cutting zone 208. Finally, the in-line dicing machine 200 can also be programmed to dice the wafer completely at either the laser cutting zone 208 or the mechanical cutting zone 210.

The laser cutter 108 of FIG. 1 employed in the laser cutting zone 208 may be comprised by, for example, an ultra-violet ("UV") laser, a visible laser (i.e.—a green laser), or a Nd-YAG laser. The laser cutter 108 may additionally be coupled with a cooling fluid stream to lower the temperature of the substrate. The laser cutter 108 can be controlled by, for example, a galvanometer. The mechanical cutting zone 210 may have the mechanical cutter 110 of FIG. 10 equipped with such cutting saw blades as a beveled blade or a standard circular blade.

The in-line dicing machine 200 utilizes separate and discrete scribing and dicing zones. As noted by FIG. 2, the laser cutting zone 208 operates on a separate chuck from the mechanical cutting zone 210 chuck.

It has been discovered that operating the mechanical cutter 110 at a separate chuck from the laser cutter 108 prevents blade lubricating water from the mechanical cutting zone 210 from scattering the laser during laser processing.

The in-line dicing machine 200 can scribe and dice packaging comprised by, for example and not by way of limitation, ball grid array ("BGA"), chip scale packaging ("CSP"), package-in-package ("PiP"), package-on-package ("PoP"), and other commonly known semiconductor manufacturing packaging.

Figure 3:
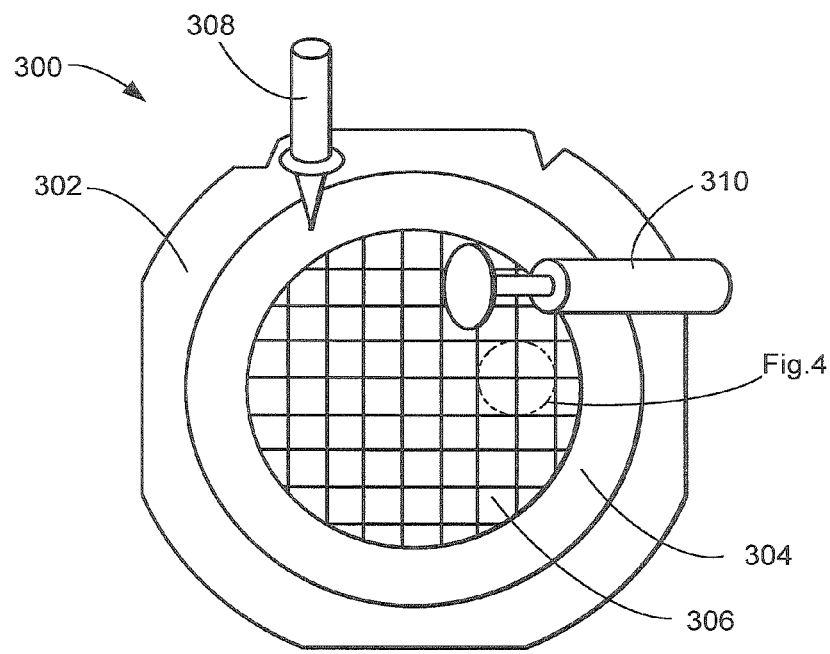
FIG. 3. is a top view of a wafer structure in accordance with an embodiment of the present invention.

Referring now to FIG. 3, therein is shown a top view of a wafer structure 300 in accordance with an embodiment of the present invention. The wafer structure 300 includes a frame 302, an adhesive tape 304, a wafer 306, a laser 308 and a mechanical cutter 310. The frame 302 can be, for example, a rigid frame. One side of the adhesive tape 304 is adhered to the frame 302. The opposing side of the adhesive tape 304 is adhered to the wafer 306. The adhesive tape 304 holds the wafer 306 intact once all the chips are diced.

The wafer 306 is scribed and/or diced by either or both of the laser 308 or the mechanical cutter 310, which are individually supported.

The in-line dicing process employs many different embodiments. One embodiment scribes the wafer 306 by application of the laser 308 and dices the wafer 306 by application of the mechanical cutter 310. Another embodiment scribes the wafer 306 by application of the mechanical cutter 310 and dices the wafer 306 by application of the laser 308. In another embodiment, the laser 308 and the mechanical cutter 310 act simultaneously on different parts of the wafer 306 or on different wafers as long as the laser 308 and the mechanical cutter 310 are sufficiently isolated from one another that contaminants such as laser vapor, cutting water, metal particles, etc. do not affect the other. In another embodiment, the laser 308 and the mechanical cutter 310 act sequentially. Yet another embodiment may dice the wafer 306 by only employing the laser 308. Another embodiment dices the wafer 306 by only employing the mechanical cutter 310. Finally, in another embodiment, the laser 308 and/or the mechanical cutter 310 scribe and/or dice along saw streets.

Figure 4:
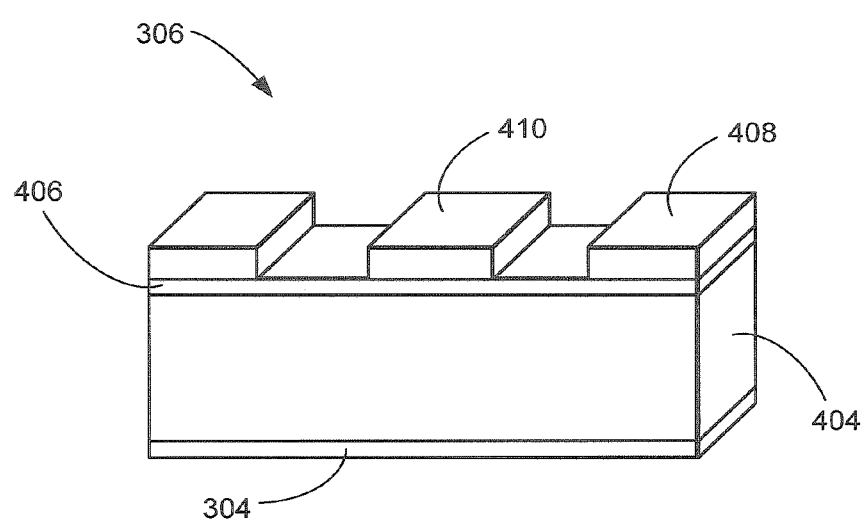
FIG. 4 is an isometric cross-sectional view of a portion of the structure of FIG. 3 in accordance with an embodiment of the present invention.

Referring now to FIG. 4, there is shown an isometric cross-sectional view of a portion of the structure of FIG. 3 in accordance with an embodiment of the present invention. The wafer 306 has the adhesive tape 304, a substrate 404, an active layer 406, a bonding pad 408, and a test pattern 410. The adhesive tape 304 is a bonding agent that bonds the substrate 404. The substrate 404 may be comprised by, for example and not by way of limitation, doped and undoped semiconductor layers, epitaxially grown semiconductor layers, silicon-on-insulator layers, and thin film transistor layers.

The active layer 406 is located above the substrate 404. The active layer may be comprised by, for example and not intended to limit the scope of applicable components, active components, active components and/or passive components. Examples of such active and passive components includes transistors, capacitors, wells, interconnects, and other known components in the field of integrated circuit technology. Located above the active layer 406 are the bonding pads 408 and the test pattern 410. The bonding pads 408 provide electrical connection between the integrated circuits on the chip and external circuits. The test pattern 410 can test for circuit failures due to, for example, electrical overstresses. The test patterns 410 can be located within a saw street.

FIGS. 5-8 provide by way of example, an embodiment of the present invention. The steps illustrated are merely representative of the embodiment and do not exclude other commonly employed or known semiconductor manufacturing techniques. Generally, the method employed by FIGS. 5-8 can be used for increasing the processing speed of thick wafers with a bonding corrosion problem or an adhesive film layer. Those having ordinary skill in the art will understand the configurations for setting up the apparatus of the present invention from the following disclosure.

Figure 5:
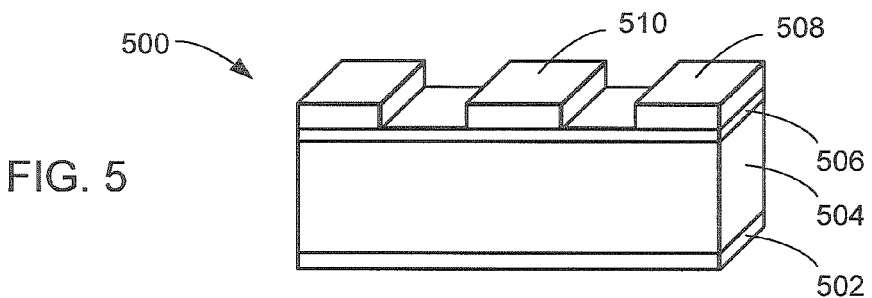
FIG. 5 is an isometric cross-sectional view of a portion of a wafer in accordance with an embodiment of the present invention.

Referring now to FIG. 5, therein is shown an isometric cross-sectional view of a portion of a wafer 500 in accordance with an embodiment of the present invention. The wafer 500 possesses an adhesive tape 502, a substrate 504, an active layer 506, a bonding pad 508, and a test pattern 510.

Figure 6:
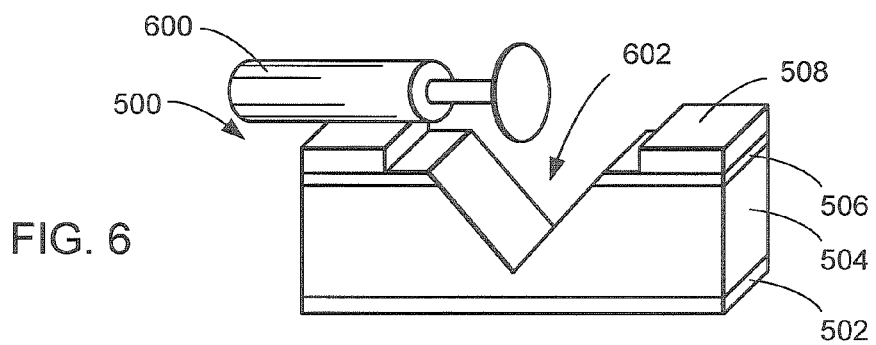
FIG. 6 is the structure of FIG. 5 in a further stage of processing.

Referring now to FIG. 6, therein is shown the structure of FIG. 5 in a further stage of processing. The wafer 500 is scribed by a first cut using a mechanical cutter 600. The first cut opening 602 only partially cuts into the substrate 504 and does not completely cut through the substrate 504. The partial cutting of the substrate 504 by the mechanical cutter 600 reduces the amount of stress absorbed by the substrate 504, decreases the cutter's kerf width, and reduces the amount of backside chipping over conventional dicing with only a mechanical cutter.

Figure 7:
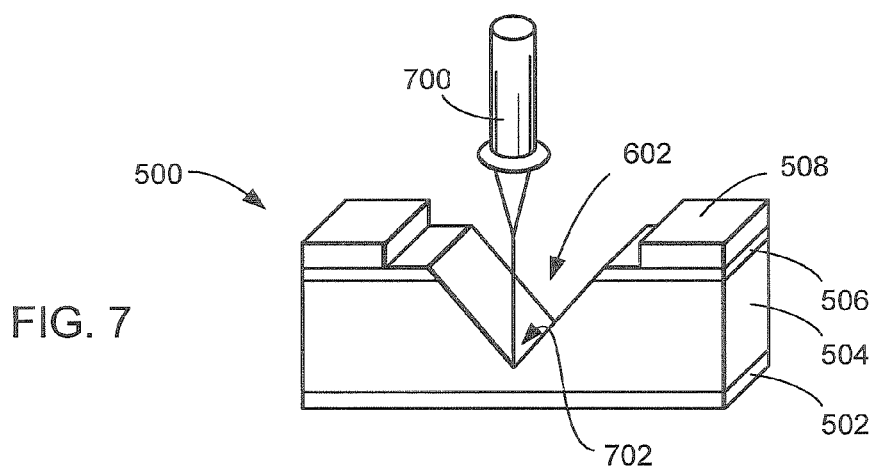
FIG. 7 is the structure of FIG. 6 in a further stage of processing.

Referring now to FIG. 7, therein is shown the structure of FIG. 6 in a further stage of processing. The wafer 500 is being diced by a second cut using a laser 700 to start a second cut opening 702. Since the laser 700 is now cutting through the substrate 504, which has been scribed, the feed rate may be performed at a much higher speed and the units per hour processed increases over that of just laser dicing.

Figure 8:
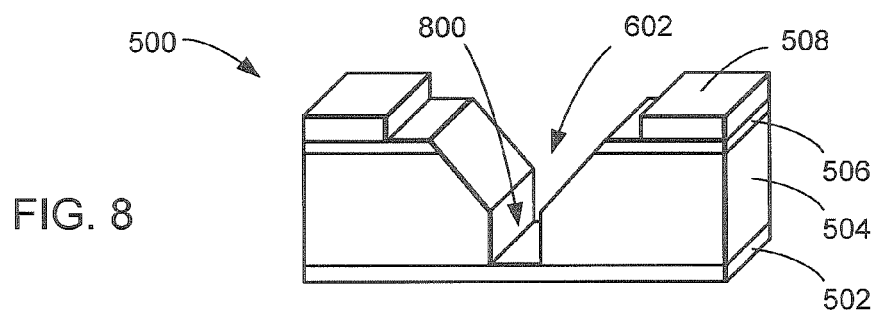
FIG. 8 is the structure of FIG. 7 in a further stage of processing.

Referring now to FIG. 8, therein is shown the structure of FIG. 7 in a further stage of processing. The wafer 500 is completely diced. The first cut opening 602 penetrated the substrate 504 partially. A second cut opening 800 completely cuts through the substrate 504. Although FIG. 8 depicts the substrate 504 diced by a two cut process, the substrate 504 can be diced by a single pass of either the laser 700 or the mechanical cutter 600.

Additionally, the substrate 504 can be diced by multiple passes along each path, in excess of two, of both the laser and the mechanical cutter, acting alone or in combination. Moreover, the substrate 504 can be scribed by multiple passes of the laser; wherein scribing of the substrate via multiple passes occurs in a test pattern region, a saw street region or an alignment region. After dicing, the known good die are individually picked from the adhesive tape and physically attached to another substrate, for example, a lead-frame.

FIGS. 9-12 provide by way of example, an embodiment of the present invention. The steps illustrated are merely representative of the embodiment and do not exclude other commonly employed or known semiconductor manufacturing techniques. Generally, the method employed by FIGS. 9-12 can be used for dicing thick wafers with a low-k dielectric layer, a copper layer or a serious metal tap peel problem.

Figure 9:
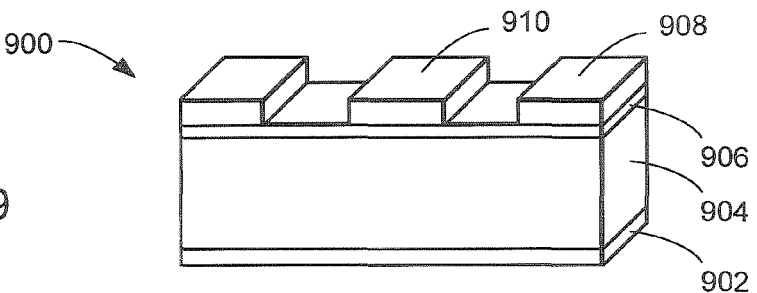
FIG. 9 is an isometric cross-section view of a portion of a wafer in accordance with an embodiment of the present invention.

Referring now to FIG. 9, therein is shown an isometric cross-sectional view of a portion of a wafer 900 in accordance with an embodiment of the present invention. The wafer 900 possesses an adhesive tape 902, a substrate 904, an active layer 906, a bonding pad 908, and a test pattern 910.

Figure 10:
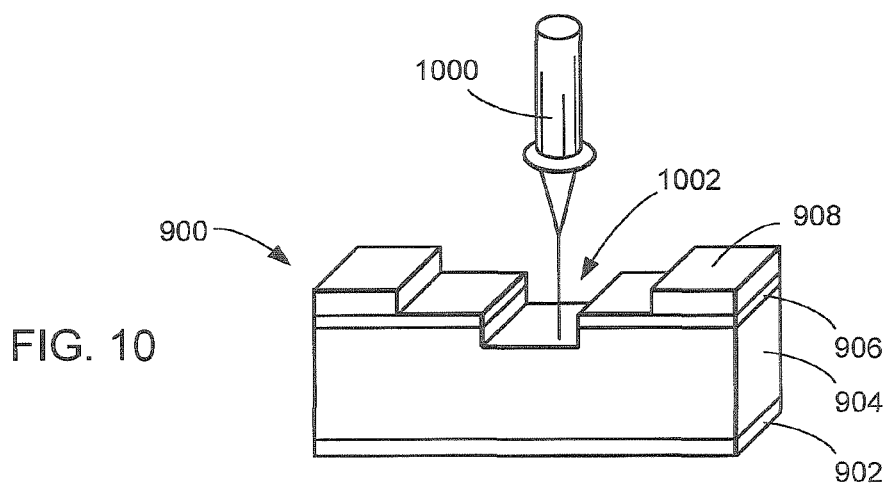
FIG. 10 is the structure of FIG. 9 in a further stage of processing.

Referring now to FIG. 10, therein is shown the structure of FIG. 9 in a further stage of processing. The wafer 900 is scribed by a first cut using a laser cutter 1000. The first cut opening 1002 only partially cuts into the substrate 904 and does not completely cut through the substrate 904. The partial cutting of the substrate 904 by the cutter laser 1000 reduces the amount of thermal stress absorbed by the wafer 900, and increases the wafer feed rate over conventional dicing with only a laser. It has been found that multiple passes by the laser 1000 along each path for the first cut opening 1002 provides a finer cut through the active layer 906 into the substrate 904.

Figure 11:
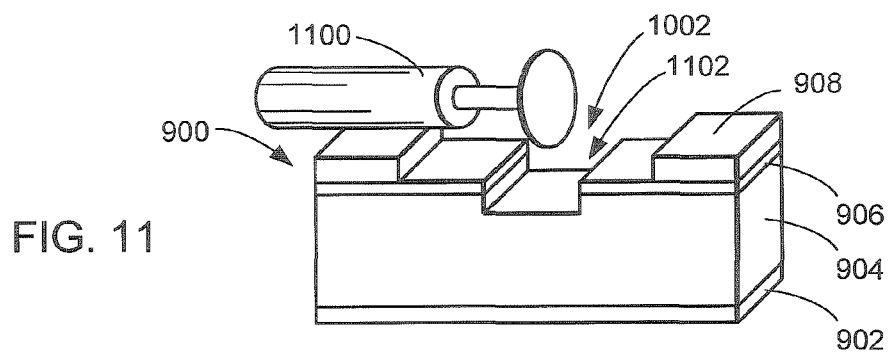
FIG. 11 is the structure of FIG. 10 in a further stage of processing.

Referring now to FIG. 11, therein is shown the structure of FIG. 10 in a further stage of processing. The wafer 900 is being diced by a second cut using a mechanical cutter 1100 to start a second cut opening 1102. Since the mechanical cutter 1100 is now cutting through the substrate 904, which is thinner, less resistance is encountered by the blade and correspondingly less stress is imparted to the substrate 904, which results in less chipping of the substrate 904.

Figure 12:
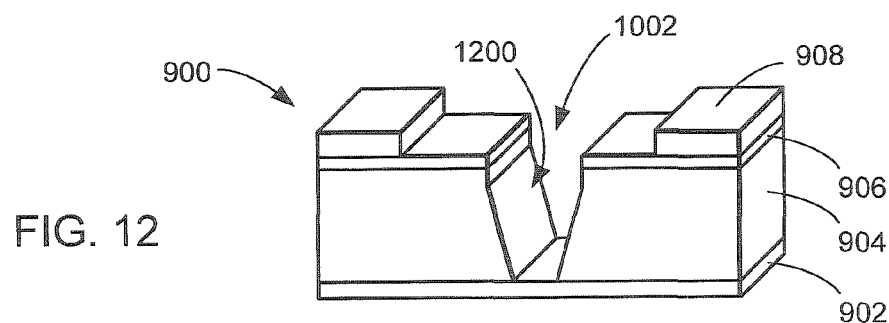
FIG. 12 is the structure of FIG. 11 in a further stage of processing.

Referring now to FIG. 12, therein is shown the structure of FIG. 11 in a further stage of processing. The wafer 900 is completely diced. The first cut opening 1002 penetrated the substrate 904 partially. A second cut opening 1200 completely cuts through the substrate 904. Although FIG. 12 depicts the substrate 904 diced by a two cut process, the substrate 904 can be diced by a single pass of either the laser or the mechanical cutter.

Additionally, the substrate 904 can be diced by multiple passes along each path, in excess of two, of both the laser and the mechanical cutter, acting alone or in combination. Moreover, the substrate 904 can be scribed by multiple passes of the laser; wherein scribing of the substrate via multiple passes occurs in a test pattern region, a saw street region or an alignment region. After dicing, the known good die are individually picked from the adhesive tape and physically attached to another substrate, for example, a lead-frame.

Figure 13:
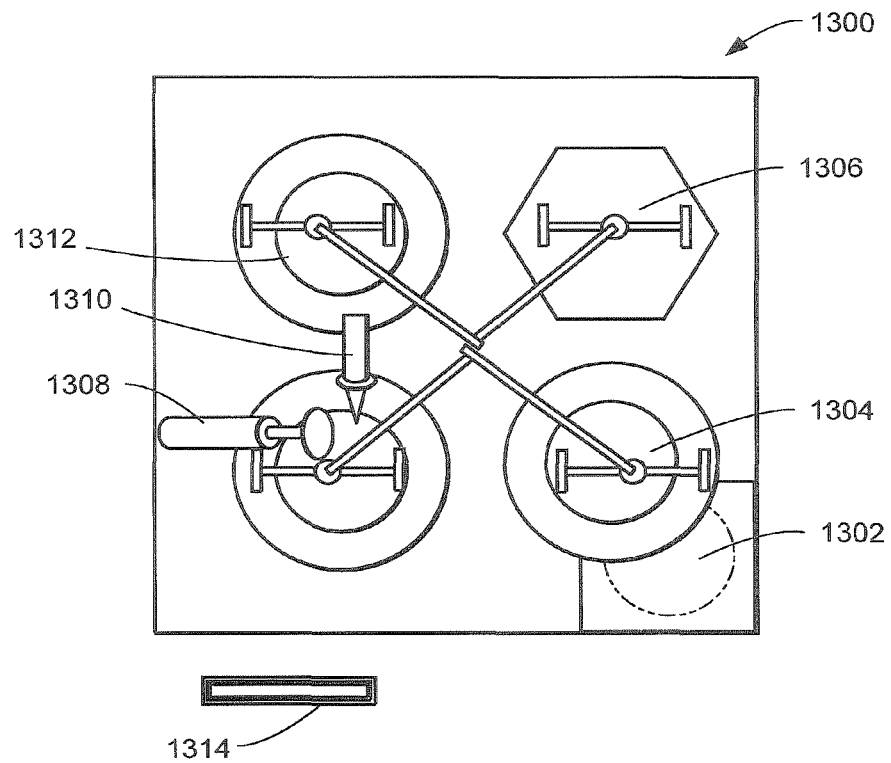
FIG. 13 is a top view of an in-line dicing machine in accordance with an embodiment of the present invention.

Referring now to FIG. 13, therein is shown a top view of an in-line dicing machine 1300 in accordance with an embodiment of the present invention. The in-line dicing machine 1300 includes a wafer cassette zone 1302, a pre-alignment stage 1304, a loader 1306, a mechanical cutter 1308, a laser cutter 1310, a cleaning zone 1312, and an operation panel 1314.

FIG. 13 depicts the in-line dicing machine 1300 wherein the mechanical cutter 1308 and the laser cutter 1310 operate within the same chamber. The mechanical cutter 1308 and the laser cutter 1310 can be individually supported or jointly mounted. The mechanical cutter 1308 and the laser cutter 1310 can operate individually of each other or they can be configured such that one follows the other. It is preferred that the mechanical cutter 1308 and the laser cutter 1310 operate individually of each other because blade lubrication water employed during mechanical cutting can scatter the laser if the laser cutter 1310 is jointly mounted to the mechanical cutter 1308.

For example and not by way of limitation, the following provides an example of how the in-line dicing machine 1300 operates. A wafer enters the in-line dicing machine 1300 via the wafer cassette zone 1302. The wafer is then transferred to the pre-alignment stage 1304 by the loader 1306. The wafer is then transferred to an area within the in-line dicing machine 1300 where the wafer is subjected to the mechanical cutter 1308 and/or the laser cutter 1310.

At this stage, the wafer can either be scribed by the mechanical cutter 1308 and diced by the laser cutter 1310 or scribed by the laser cutter 1310 and diced by the mechanical cutter 1308. Alternatively, the wafer could be diced by either the mechanical cutter 1308 or the laser cutter 1310 independently. After scribing and dicing or just dicing, the wafer is transferred to the cleaning zone 1312. After cleaning, the wafer is transferred to the pre-alignment stage 1304 and then to the wafer cassette zone 1302.

Figure 14:
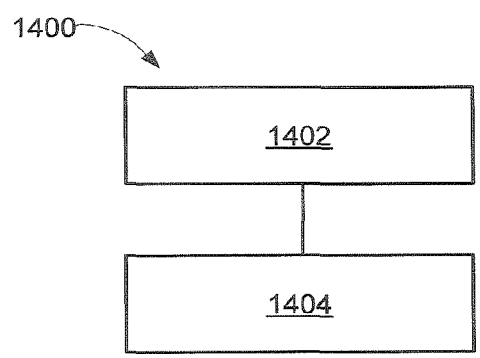
FIG. 14 is a flow chart for an integrated, integrated circuit singulation system in accordance with an embodiment of the present invention.

Referring now to FIG. 14, therein is shown a flow chart for an integrated, integrated circuit singulation system 1400 in accordance with an embodiment of the present invention. The system 1400 includes scribing a substrate using mechanical cutting or a plurality of passes of laser cutting in a block 1402; and dicing the substrate using mechanical cutting or laser cutting in a block 1404.

It has been discovered that the present invention thus has numerous advantages. One such advantage is that the in-line system can reduce the wafer handling risk. The wafer handling risk is reduced because the wafer is processed within the same machine and need not be transferred to another machine to complete the dicing operation.

Another advantage of the present invention is that the process time is reduced over that of conventional multi-step dicing by a laser or mechanical cutter alone. The combination of laser scribing and mechanical cutter dicing or mechanical cutter scribing and laser dicing decreases the process time by increasing the feed rate of the wafer while still maintaining an acceptable process yield.

Yet still another advantage of the present invention is that the combination of laser scribing and mechanical cutter dicing or mechanical cutter scribing and laser dicing improves the dicing cutter product quality by reducing the amount of cracks, chips and film burrs. By deceasing the amount of these defects the product yield of known good die can be increased, thereby, making the process more cost efficient.

Thus, it has been discovered that the integrated circuit singulation method and apparatus of the present invention furnishes important and heretofore unknown and unavailable solutions, capabilities, and functional advantages for substrate dicing. For instance, wafer handling risk is reduced, the units per hour processed is increased thereby leading to higher productivity, and the amount of defects produced during the dicing operation is reduced. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method for an integrated circuit singulation system comprising:
   scribing a substrate using a plurality of passes along each path of laser cutting through an active layer of the substrate; and
   dicing the substrate using a plurality of passes along each path of mechanical cutting.

2. The method as claimed in claim 1 wherein:
   scribing during the plurality of passes of laser cutting uses visible light, ultraviolet light, or a combination thereof.

3. The method as claimed in claim 1 wherein:
   scribing during the plurality of passes of laser cutting traverses a scribe cut a plurality of times.

4. The method as claimed in claim 1 wherein:
   scribing and dicing occur simultaneously.

5. The method as claimed in claim 1 wherein:
   scribing and dicing occur sequentially.

6. A method for an integrated circuit singulation system comprising:
   scribing a wafer using a plurality of passes along each path of laser cutting through an active layer in a test pattern, a saw street or an alignment region of the wafer; and
   dicing the wafer using a plurality of passes along each path of mechanical cutting after laser cutting.

7. The method as claimed in claim 6 wherein:
   dicing using the mechanical cutting is performed with a circular or beveled blade.

8. The method as claimed in claim 6 wherein:
   scribing using the plurality of passes of laser cutting uses visible light, ultraviolet light, or a combination thereof.

9. The method as claimed in claim 6 wherein:
   scribing and dicing occur simultaneously on different parts of the wafer.

10. The method as claimed in claim 6 wherein:
    scribing and dicing occur sequentially.

* * * * *